(12) United States Patent
Ito

(10) Patent No.: US 11,322,376 B2
(45) Date of Patent: May 3, 2022

(54) PEELING APPARATUS

(71) Applicant: DISCO CORPORATION, Tokyo (JP)

(72) Inventor: Fumiaki Ito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 372 days.

(21) Appl. No.: 16/739,423

(22) Filed: Jan. 10, 2020

(65) Prior Publication Data

US 2020/0227292 A1 Jul. 16, 2020

(30) Foreign Application Priority Data

Jan. 15, 2019 (JP) .............................. JP2019-004269

(51) Int. Cl.
  *B32B 43/00* (2006.01)
  *H01L 21/67* (2006.01)
  *H01L 21/683* (2006.01)

(52) U.S. Cl.
  CPC .... *H01L 21/67132* (2013.01); *H01L 21/6836* (2013.01); *B32B 43/006* (2013.01); *H01L 2221/6834* (2013.01); *H01L 2221/68386* (2013.01); *Y10T 156/11* (2015.01); *Y10T 156/1168* (2015.01); *Y10T 156/19* (2015.01)

(58) Field of Classification Search
  CPC ... B32B 43/006; Y10T 156/11; Y10T 156/19; Y10T 156/1168
  See application file for complete search history.

(56) References Cited

U.S. PATENT DOCUMENTS

| | | | |
|---|---|---|---|
| 2002/0162628 A1* | 11/2002 | Yamasaki | H05K 3/00 156/701 |
| 2015/0251870 A1* | 9/2015 | Degawa | B32B 38/10 156/538 |
| 2017/0326865 A1* | 11/2017 | Ayabe | B32B 43/006 |

FOREIGN PATENT DOCUMENTS

JP 2016201488 A 12/2016

* cited by examiner

*Primary Examiner* — Philip C Tucker
*Assistant Examiner* — Nickolas R Harm
(74) *Attorney, Agent, or Firm* — Greer Burns & Crain Ltd.

(57) ABSTRACT

A peeling apparatus includes a holding table for holding a plate-shaped workpiece having an upper surface and a lower surface, the upper surface being covered with a protective member. The lower surface of the workpiece is held on the holding table. A peeling mechanism peels off the protective member from the workpiece, and a recovery box is set in the peeling apparatus for recovering the protective member. The recovery box has an upper opening from which the protective member is put into the recovery box. The peeling apparatus further includes a removing mechanism for allowing the protective member to be put into the recovery box from the upper opening, and also allowing the protective member recovered into the recovery box to be removed from the recovery box, while operating the peeling mechanism to peel off the protective member.

4 Claims, 5 Drawing Sheets

PEELING APPARATUS

BACKGROUND OF THE INVENTION

Field of the Invention

The present invention relates to a peeling apparatus for peeling off a protective member attached to a plate-shaped workpiece.

Description of the Related Art

A tape mounter capable of peeling off a tape is known in the art (see Japanese Patent Laid-open No. 2016-201488, for example). After grinding the back side of a plate-shaped workpiece by using a grinding apparatus in the condition where a protective member is attached to the front side of the workpiece, the tape mounter is used to attach a dicing tape both to the back side of the workpiece and to one side of a ring frame, the dicing tape being larger in diameter than the workpiece, thereby uniting the workpiece and the ring frame through the dicing tape. Thereafter, the protective member is peeled off from the front side of the workpiece by the tape mounter.

SUMMARY OF THE INVENTION

The protective member peeled off from the workpiece is accumulated in a recovery box having an upper opening. In other words, the protective member peeled off from the workpiece is dropped into the recovery box from the upper opening thereof. The protective members successively peeled off from the workpieces are accumulated in the recovery box. Before reaching a filled condition of the recovery box, the protective members accumulated in the recovery box are removed from the recovery box by an operator. In performing such a removing operation that the protective members accumulated in the recovery box are removed by the operator, the peeling apparatus must be stopped in operation for the following reasons.

The recovery box is retracted from the peeling apparatus, so as to remove the protective members accumulated in the recovery box, so that the area where the recovery box has been set becomes a space. Accordingly, the hand of the operator may enter this space and there is a possibility for a transfer mechanism for transferring the protective member to the recovery box to interfere with the operator's hand, causing injury to the operator. For this reason, the peeling apparatus must be stopped in operation.

In this manner, the recovery box is retracted from the peeling apparatus, so as to remove the protective members accumulated in the recovery box. Thereafter, the protective member peeled off from the next workpiece is newly transferred to the empty area from which the recovery box has been retracted. For this reason, the peeling apparatus must be stopped in operation until the recovery box is set again in this area.

It is therefore an object of the present invention to provide a peeling apparatus which can eliminate the possibility for the operator to be injured by the transfer mechanism for transferring the protective member to the recovery box in peeling off the protective member from the workpiece and then removing the protective member from the recovery box.

It is another object of the present invention to provide a peeling apparatus which can continuously perform an operation of attaching an adhesive tape (dicing tape) to the workpiece and an operation of peeling off the protective member from the workpiece.

In accordance with an aspect of the present invention, there is provided a peeling apparatus including a holding table for holding a plate-shaped workpiece having an upper surface and a lower surface, the upper surface of the workpiece being covered with a protective member, the lower surface of the workpiece being held on the holding table; peeling means for peeling off the protective member from the workpiece held on the holding table; and a recovery box adapted to be set in the peeling apparatus for recovering the protective member peeled off by the peeling means; in which the recovery box has an upper opening from which the protective member is to be put into the recovery box, and the peeling apparatus further includes a removing mechanism for allowing the protective member to be put into the recovery box from the upper opening and also allowing the protective member recovered into the recovery box to be removed from the recovery box, during the operation of operating the peeling means to peel off the protective member.

Preferably, the removing mechanism has an expanding and contracting function of expanding the upper opening of the recovery box to a larger opening and contracting the larger opening to the upper opening, whereby when the upper opening is expanded to the larger opening, an additional opening is defined adjacent to the upper opening, and the protective member recovered into the recovery box is removable from the additional opening.

Preferably, the removing mechanism includes a door openably provided on one side surface of the recovery box, whereby when the door is opened, a side opening is formed and the protective member recovered into the recovery box is removable from the side opening.

Preferably, the removing mechanism includes a slider for allowing the recovery box to be slidably moved between a first position set in the peeling apparatus and a second position retracted from the first position, a receiving plate provided so as to cover the upper opening of the recovery box for receiving the protective member from the peeling means, and a dropping portion for dropping the protective member from the receiving plate into the recovery box, whereby when the recovery box is moved to the second position, the protective member is removable from the upper opening of the recovery box.

According to the peeling apparatus of the present invention, the protective members accumulated in the recovery box is removable from the recovery box during the operation of peeling off the protective member from the workpiece and then putting the protective member into the recovery box. Accordingly, a continuous operation of the peeling apparatus can be performed. Further, in the case where the peeling apparatus functions as a tape mounter for attaching a dicing tape to a ring frame and the workpiece and next peeling off the protective member attached to the workpiece, the protective member is removable from the recovery box during the operation of peeling off the protective member, so that the tape mounter can be operated continuously, that is, the dicing tape can be attached to the workpiece consecutively during the peeling operation.

According to a preferred embodiment of the present invention, the removing mechanism has an expanding and contracting function of expanding the upper opening of the recovery box to a larger opening and contracting this larger opening to the original upper opening, whereby when the upper opening is expanded to the larger opening, an additional opening is defined adjacent to the original upper opening, and the protective member is removable from this additional opening. Thus, the protective members accumulated in the recovery box is removable from this additional opening during the peeling operation, so that the continuous operation of the peeling apparatus can be performed.

According to another preferred embodiment of the present invention, the removing mechanism includes a door openably provided on one side surface of the recovery box, whereby when this door is opened, a side opening is formed and the protective member recovered into the recovery box is removable from this side opening. Thus, the protective members accumulated in the recovery box is removable during the peeling operation, so that the continuous operation of the peeling apparatus can be performed.

According to still another preferred embodiment of the present invention, the removing mechanism includes a slider for allowing the recovery box to be slidably moved between a first position set in the peeling apparatus and a second position retracted from the first position, a receiving plate provided so as to cover the upper opening of the recovery box for receiving the protective member from the peeling means, and a dropping portion for dropping the protective member from the receiving plate into the recovery box, whereby when the recovery box is moved to the second position, the protective member is removable from the upper opening of the recovery box. Thus, the protective members accumulated in the recovery box is removable during the peeling operation, so that the continuous operation of the peeling apparatus can be performed.

The above and other objects, features, and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENT

Figure 1:
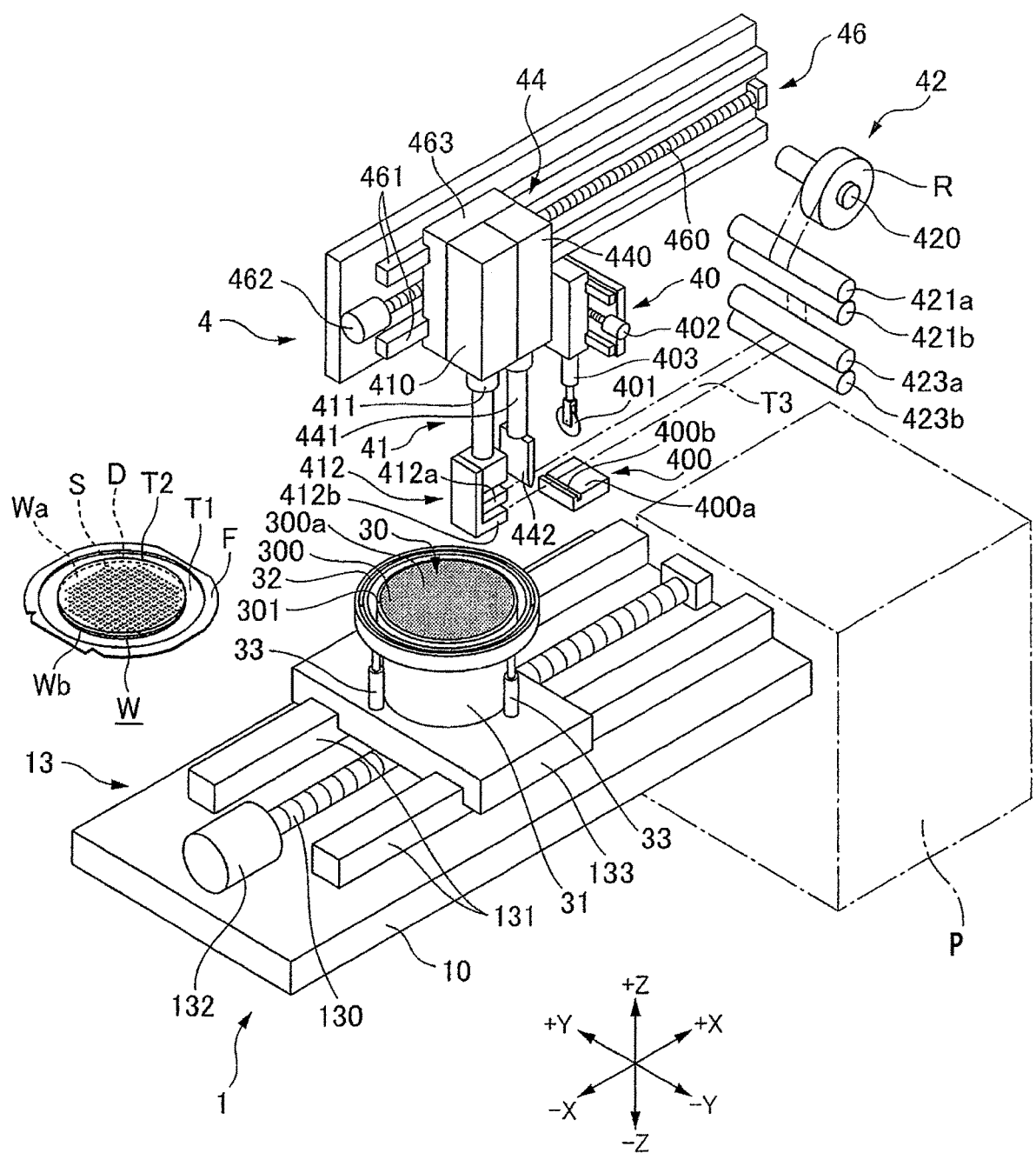
FIG. 1 is a perspective view of a peeling apparatus according to the present invention.

Referring to FIG. 1, a peeling apparatus 1 according to the present invention is illustrated. Reference symbol W denotes a plate-shaped workpiece having an upper surface Wa and a lower surface Wb. The peeling apparatus 1 is an apparatus for peeling off a sheet-shaped protective member T2 attached to the upper surface Wa of the plate-shaped workpiece W by using a belt-shaped peeling tape T3. The peeling apparatus 1 essentially includes a holding table 30 for holding the lower surface Wb of the workpiece W whose upper surface Wa is covered with the protective member T2 and peeling means 4 for peeling off the protective member T2 from the upper surface Wa of the workpiece W held on the holding table 30.

The workpiece W illustrated in FIG. 1 is a semiconductor wafer having a circular outside shape. The semiconductor wafer is formed of silicon as a base material, for example. The upper surface Wa of the workpiece W is partitioned by a plurality of crossing division lines S intersecting at right angles to thereby define a plurality of rectangular separate regions where a plurality of devices D such as integrated circuits (ICs) are respectively formed.

The protective member T2 is attached to the upper surface Wa of the workpiece W so as to cover the whole of the upper surface Wa. The protective member T2 is composed of a circular sheet and a resin film formed on the circular sheet, for example. The protective member T2 may be formed by using a protective member forming apparatus (not illustrated). In other words, a liquid resin curable by applying ultraviolet light is supplied to the upper surface of the circular sheet, and the upper surface Wa of the workpiece W is next pressed on the liquid resin to thereby spread the liquid resin on the whole of the upper surface Wa. Thereafter, ultraviolet light is applied to the liquid resin to cure the liquid resin, thereby forming the resin film on the upper surface of the circular sheet.

The workpiece W may be formed of any other material such as gallium arsenide, sapphire, gallium nitride, and silicon carbide. The protective member T2 is not limited to a protective member composed of a circular sheet and a resin film as mentioned above.

A dicing tape T1 is attached to the lower surface Wb of the workpiece W. The dicing tape T1 is a circular tape having a diameter larger than that of the workpiece W. More specifically, the dicing tape T1 is composed of a base sheet and an adhesive layer formed on the base sheet. A central portion of the adhesive layer of the dicing tape T1 is attached to the lower surface Wb of the workpiece W. A peripheral portion of the adhesive layer of the dicing tape T1 is attached to a ring frame F. Accordingly, the workpiece W is supported through the dicing tape T1 to the ring frame F, so that handling of the workpiece W can be effected through the ring frame F. In the following description, the X direction includes the +X direction illustrated by an arrow +X in the drawings and the −X direction illustrated by an arrow −X in the drawings. Similarly, the Y direction includes the +Y direction illustrated by an arrow +Y in the drawings and the −Y direction illustrated by an arrow −Y in the drawings. Further, the Z direction includes the +Z direction illustrated by an arrow +Z in the drawings and the −Z direction illustrated by an arrow −Z in the drawings. The X direction and the Y direction are perpendicular to each other to define a horizontal plane, and the Z direction is perpendicular to this horizontal plane.

The peeling apparatus 1 has a base 10 extending in the X direction. The base 10 has a shape like a rectangular prism. Table moving means 13 for moving the holding table 30 in the X direction is provided on the base 10. The table moving means 13 includes a ball screw 130 supported on the base 10 so as to extend in the X direction, a motor 132 connected to one end of the ball screw 130 for rotating the ball screw 130, a pair of guide rails 131 provided on the base 10 so as to extend parallel to the ball screw 130, and a movable member 133 slidably mounted on the pair of guide rails 131 so as to be movable in the X direction. A support member 31 is provided on the upper surface of the movable member 133, and the holding table 30 is supported to the upper end of the support member 31. A pair of grooves 133a is formed on the lower surface of the movable member 133, and the pair of guide rails 131 is slidably engaged with the pair of grooves 133a. A nut portion (not illustrated) is formed on the lower surface of the movable member 133 at a central portion thereof, and the ball screw 130 is threadedly engaged with this nut portion. Accordingly, when the ball screw 130 is rotated by the motor 132, the movable member 133 is moved in the X direction along the guide rails 131, so that the holding table 30 is moved in the X direction.

The holding table 30 includes a suction holding portion 300 for holding the workpiece W under suction and a frame 301 for supporting the suction holding portion 300. The suction holding portion 300 is formed from a porous member or the like. The suction holding portion 300 is connected to a vacuum source (not illustrated) such as a vacuum generating apparatus for producing a suction force. The suction holding portion 300 has an upper exposed surface as a flat holding surface 300a for holding the workpiece W. When the vacuum source is operated, the suction force generated by the vacuum source is transmitted to the holding surface 300a of the suction holding portion 300, so that the workpiece W can be held on the holding surface 300a under suction.

The holding table 30 is surrounded by frame fixing means 32 for fixing the ring frame F. The frame fixing means 32 has an annular shape as viewed in plan, and the ring frame F is adapted to be placed on the frame fixing means 32. The frame fixing means 32 is also connected to the vacuum source. The ring frame F placed on the frame fixing means 32 is fixed by the suction force produced by the vacuum source. A plurality of piston mechanisms 33 are arranged at equal intervals around the support member 31 in the circumferential direction thereof so as to be connected to the frame fixing means 32. Accordingly, the frame fixing means 32 is vertically movable in the Z direction by the piston mechanisms 33. As a modification, the frame fixing means 32 may be replaced by a plurality of mechanical clamps provided on the outer circumference of the holding table 30 so as to be opened and closed by springs or the like.

The peeling means 4 for peeling off the protective member T2 from the workpiece W held on the holding table 30 is provided above the path of movement of the holding table 30. The peeling means 4 includes tape cutting means 40 for cutting the peeling tape T3 into a piece having a predetermined length, peeling tape supplying means 42 for drawing the peeling tape T3 from a tape roll R and supplying the peeling tape T3 to the protective member T2 attached to the upper surface Wa of the workpiece W, holding means 41 for holding one end of the peeling tape T3 drawn from the tape roll R, tape pressing means 44 for pressing the peeling tape T3 to a peripheral area of the protective member T2 and attaching the peeling tape T3 to the protective member T2, and X moving means 46 for moving the tape pressing means 44 and the holding means 41 in the X direction.

The X moving means 46 includes a ball screw 460 having an axis extending in the X direction, a pair of guide rails 461 extending parallel to the ball screw 460, a motor 462 connected to one end of the ball screw 460 for rotating the ball screw 460, and a movable plate 463 having an internal nut threadedly engaged with the ball screw 460 and a side portion slidably mounted on the guide rails 461. Accordingly, when the ball screw 460 is rotated by the motor 462, the movable plate 463 is moved in the X direction along the guide rails 461. The tape pressing means 44 and the holding means 41 are mounted on the movable plate 463. Accordingly, the tape pressing means 44 and the holding means 41 are moved in the X direction together with the movable plate 463.

The peeling tape supplying means 42 includes a reel 420 on which the tape roll R is mounted, the tape roll R being formed by winding the peeling tape T3, a pair of guide rollers 421a and 421b for downward guiding the peeling tape T3 drawn from the tape roll R, and a pair of feed rollers 423a and 423b located below the guide rollers 421a and 421b. Back tension is applied to the reel 420 by a control mechanism (not illustrated) to eliminate a slack in the peeling tape T3 drawn from the tape roll R, thereby adjusting the tension of the peeling tape T3. The guide rollers 421a and 421b function to apply tension to the peeling tape T3 by passing the peeling tape T3 between the guide rollers 421a and 421b while bending the peeling tape T3 and then guide the peeling tape T3 toward the feed rollers 423a and 423b. The feed rollers 423a and 423b function to feed the peeling tape T3 guided by the guide rollers 421a and 421b toward the holding means 41.

The peeling tape T3 is a heat sealable tape having a two-layer structure composed of a base sheet and an adhesive layer formed on the base sheet, in which the adhesive layer is adapted to be bonded to the peripheral portion of the protective member T2 by applying heat thereto. The base sheet is formed of resin such as polyethylene terephthalate. However, the material of the base sheet is not especially limited. The adhesive layer is preferably formed of thermosetting resin such as epoxy resin. The adhesion of the peeling tape T3 to the protective member T2 is set higher than the adhesion of the protective member T2 to the workpiece W. The peeling tape T3 is wound around the reel 420 in the condition where the adhesive layer becomes inside of the base sheet in the form of the tape roll R (i.e., the adhesive layer becomes a lower layer under the base sheet in a stretched condition). The peeling tape T3 is not limited to such a heat sealable tape as mentioned above.

The holding means 41 includes a support block 410 fixed to the side surface of the movable plate 463 of the X moving means 46, a cylinder mechanism 411 supported by the support block 410, and a holding member 412 vertically movable by the cylinder mechanism 411. The holding member 412 includes a fixed lug 412b having an L-shape as viewed in side elevation and a movable lug 412a opposed to the fixed lug 412b in the Z direction so as to be movable toward and away from the fixed lug 412b. By moving the movable lug 412a toward the fixed lug 412b, one end of the peeling tape T3 can be held between the movable lug 412a and the fixed lug 412b. In the condition where the peeling tape T3 is held between the movable lug 412a and the fixed lug 412b, the holding member 412 can be moved by the cylinder mechanism 411 to such a vertical position that the peeling tape T3 can suitably be attached to the protective member T2 attached to the workpiece W held on the holding table 30. Conversely, by moving the movable lug 412a away from the fixed lug 412b, the holding of one end of the peeling tape T3 by the holding member 412 can be canceled.

The tape pressing means 44 is located between the pair of feed rollers 423a and 423b and the holding means 41. The tape pressing means 44 includes a support block 440 fixed to the side surface of the movable plate 463 of the X moving means 46, a pressure plate elevating mechanism 441 such as an air cylinder supported by the support block 440, and a pressure plate 442 vertically movable by the pressure plate elevating mechanism 441.

The pressure plate 442 is provided with a heater (not illustrated) for generating heat by passing a current. In operating the pressure plate elevating mechanism 441 to lower the pressure plate 442 and press the pressure plate 442 on the peeling tape T3 against the protective tape T2 at its peripheral portion, thereby attaching the peeling tape T3 to the protective member T2, the heater is operated to heat the pressure plate 442, thereby partially melting the peeling tape T3 pressed on the protective member T2 (heat sealing). Accordingly, the peeling tape T3 can be well attached to the protective member T2.

The tape cutting means 40 is located between the pair of feed rollers 423a and 423b and the tape pressing means 44. As illustrated in FIG. 1, the tape cutting means 40 includes a mounting plate 400 having a mounting surface 400a for mounting the adhesive layer (lower layer) of the peeling tape T3 thereon and a groove 400b formed on the mounting surface 400a so as to extend along the width of the peeling tape T3 (in the Y direction), a cutter 401 adapted to move in the groove 400b in the direction of extension of the groove 400b, cutter elevating means 403 such as an air cylinder for vertically moving the cutter 401, and cutter moving means 402 such as a ball screw mechanism for supporting the cutter 401 through the cutter elevating means 403 and moving the cutter 401 in the direction of extension of the groove 400b (in the Y direction). The cutter elevating means 403 is operated to move the cutter 401 in the Z direction toward or away from the mounting surface 400a.

As a modification, the peeling apparatus 1 may be so configured as to also function as a tape mounter capable of attaching the dicing tape T1 to the lower surface Wb of the workpiece W. In this case, the tape mounter includes an attaching roller for attaching a belt-shaped dicing tape to the workpiece W and a cutter for cutting the belt-shaped dicing tape along the outer circumference of the workpiece W to obtain the circular dicing tape T1. The attaching roller and the cutter are provided near one end of the base 10 in the −X direction.

There will now be described an operation of cutting the peeling tape T3 and an operation of peeling off the protective member T2 from the workpiece W by using the peeling tape T3 in the peeling apparatus 1.

First, the workpiece W supported through the dicing tape T1 to the ring frame F is mounted on the holding surface 300a of the holding table 30 in the condition where the protective member T2 is oriented upward. Further, the ring frame F is mounted on the frame fixing means 32 surrounding the outer circumference of the holding table 30. Thereafter, the vacuum source connected to the holding surface 300a is operated to hold under suction the workpiece W on the holding surface 300a and also hold under suction the ring frame F on the frame fixing means 32.

Thereafter, the feed rollers 423a and 423b illustrated in FIG. 1 are operated to feed the peeling tape T3 from the tape roll R toward the holding means 41. The adhesive layer (lower layer) of the peeling tape T3 is mounted on the mounting surface 400a of the mounting plate 400 of the tape cutting means 40, and one end of the peeling tape T3 is positioned on the upper surface of the fixed lug 412b of the holding means 41. Thereafter, the movable lug 412a is moved toward the fixed lug 412b to hold one end of the peeling tape T3 between the fixed lug 412b and the movable lug 412a of the holding means 41. Thereafter, the X moving means 46 is operated to move the holding means 41 in the −X direction and thereby pull the peeling tape T3 in the −X direction. In this stage, the pressure plate 442 of the tape pressing means 44 and the cutter 401 of the tape cutting means 40 are in a standby condition above the peeling tape T3.

The holding table 30 is moved in the +X direction to position the peripheral portion of the protective member T2 directly below the tape pressing means 44. Thereafter, as illustrated in FIG. 2, the pressure plate 442 heated by the heater included therein is lowered in the −Z direction so that the lower end of the pressure plate 442 presses the peeling tape T3 against the peripheral portion of the protective member T2.

Accordingly, the adhesive layer of the peeling tape T3 is thermally bonded to the protective member T2 (heat sealing).

Figure 2:
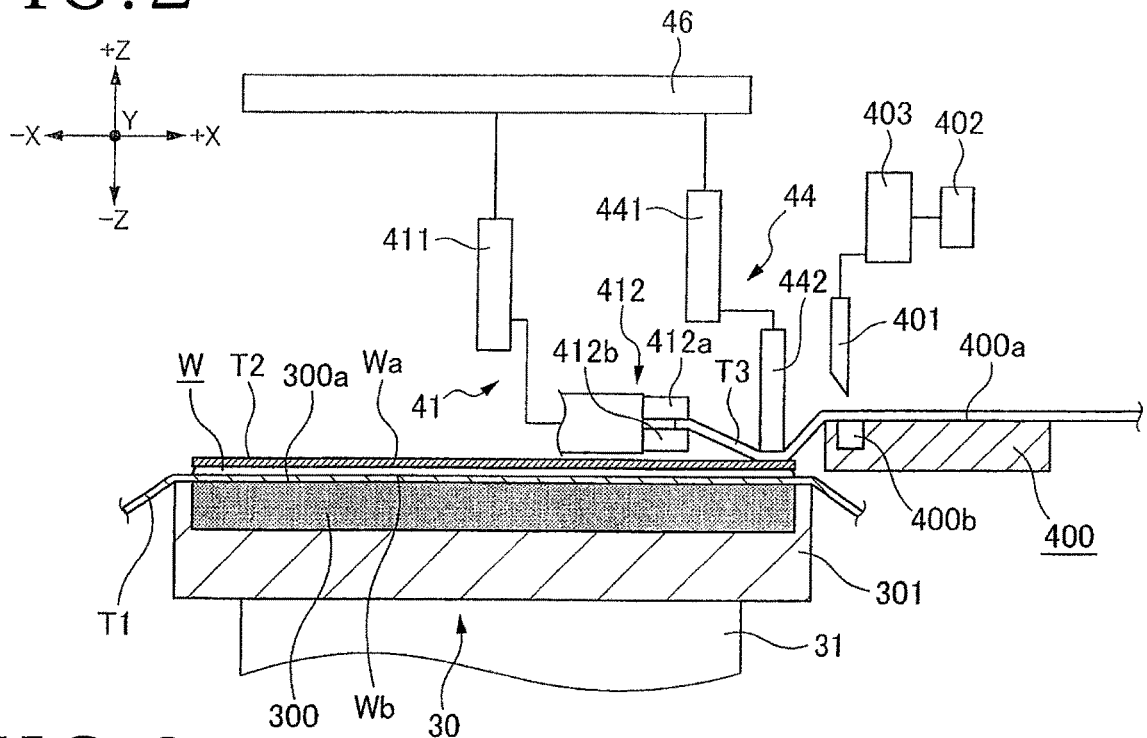
FIG. 2 is a sectional view depicting an operation of attaching a peeling tape held by holding means to a protective member attached to a workpiece held on a holding table and next cutting the peeling tape.

In this condition, the cutter 401 is moved to a start position in the −Y direction (toward the front side of the sheet plane of FIG. 2). The start position is the position directly above one end of the groove 400b of the mounting plate 400 in the −Y direction, in which a side portion of the mounting plate 400 in the −Y direction is exposed from the side edge of the peeling tape T3 in the −Y direction. Thereafter, the cutter elevating means 403 is operated to lower the cutter 401 until the lower end of the cutter 401 comes into the groove 400b. Thereafter, the cutter moving means 402 is operated to move the cutter 401 in the +Y direction along the groove 400b, thereby cutting the peeling tape T3 along the width thereof. After cutting the peeling tape T3 as mentioned above, the cutter 401 and the pressure plate 442 are raised in the +Z direction away from the peeling tape T3.

Figure 3:
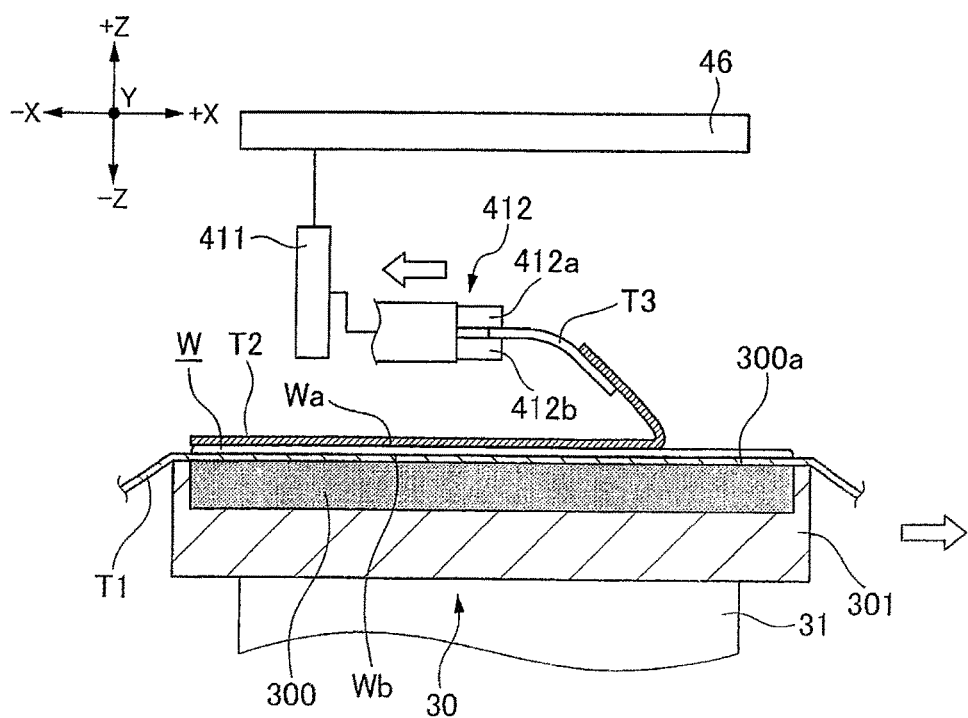
FIG. 3 is a sectional view depicting an operation of relatively moving the holding means holding the peeling tape attached to the protective member and the holding table holding the workpiece to thereby peel off the protective member from the workpiece.

Thereafter, the holding means 41 holding the peeling tape T3 is raised to peel off a part of the protective member T2 from the upper surface Wa of the workpiece W. Thereafter, as illustrated in FIG. 3, the X moving means 46 is operated to move the holding means 41 in the −X direction, and at the same time, the table moving means 13 (see FIG. 1) is operated to move the holding table 30 in the +X direction. Accordingly, the holding means 41 is moved in the radial direction of the workpiece W from the outer circumference of the workpiece W toward the center thereof. As a modification, a roller (not illustrated) may be rotatably provided above the path of movement of the holding table 30. In this case, the protective member T2 is peeled off as coming into contact with the roller, thereby suppressing the occurrence of possible breaking of the protective member T2 in peeling off the protective member T2.

It is sufficient that the holding means 41 is moved in the radial direction of the workpiece W from the outer circumference of the workpiece W toward the center thereof to thereby peel off the protective member T2 from the workpiece W. Accordingly, as a modification, only the holding means 41 may be moved in the −X direction without moving the holding table 30 in the +X direction, thereby peeling off the protective member T2.

After completely peeling off the protective member T2 from the upper surface Wa of the workpiece W, the holding means 41 holding the peeling tape T3 attached to the protective member T2 is moved to the position above a box area P illustrated by a phantom line in FIG. 1, in which this box area P is defined below the peeling tape supplying means 42 and near the other end of the base 10 in the +X direction. This box area P is an area for setting a recovery box 2 which will hereinafter be described. When the holding means 41 is moved to the position above the recovery box 2 set in the box area P, the holding of the peeling tape T3 by the holding means 41 is canceled, so that the protective member T2 attached to the peeling tape T3 falls into the recovery box 2 due to its own weight.

(Recovery Box and Removing Mechanism According to a First Preferred Embodiment)

In the box area P below the peeling tape supplying means 42 and near the other end of the base 10 in the +X direction in the peeling apparatus 1, a recovery box 2 illustrated in FIGS. 4A and 4B for recovering the protective member T2 peeled off by the peeling means 4 is provided (this recovery box 2 will hereinafter be regarded as a recovery box 2 according to the first preferred embodiment). Further, a removing mechanism 5 is also provided in the box area P. While the protective member T2 is being peeled off by the peeling means 4, the removing mechanism 5 allows the protective member T2 to be put into the recovery box 2 from an opening 20 thereof and also allows the protective member T2 recovered into the recovery box 2 to be removed from the recovery box 2 (this removing mechanism 5 will hereinafter be regarded as a removing mechanism 5 according to the first preferred embodiment). The location of the recovery box 2 and the removing mechanism 5 is not limited to that illustrated in FIG. 1.

Figure 4A:
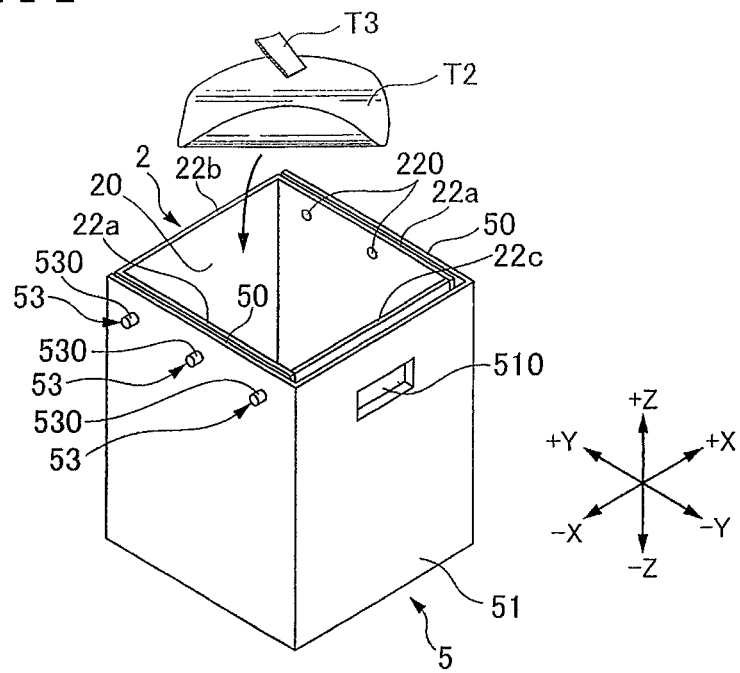
FIG. 4A is a perspective view depicting a recovery box and a removing mechanism according to a first preferred embodiment of the present invention in the condition where an upper opening of the recovery box is not expanded.
Figure 4B:
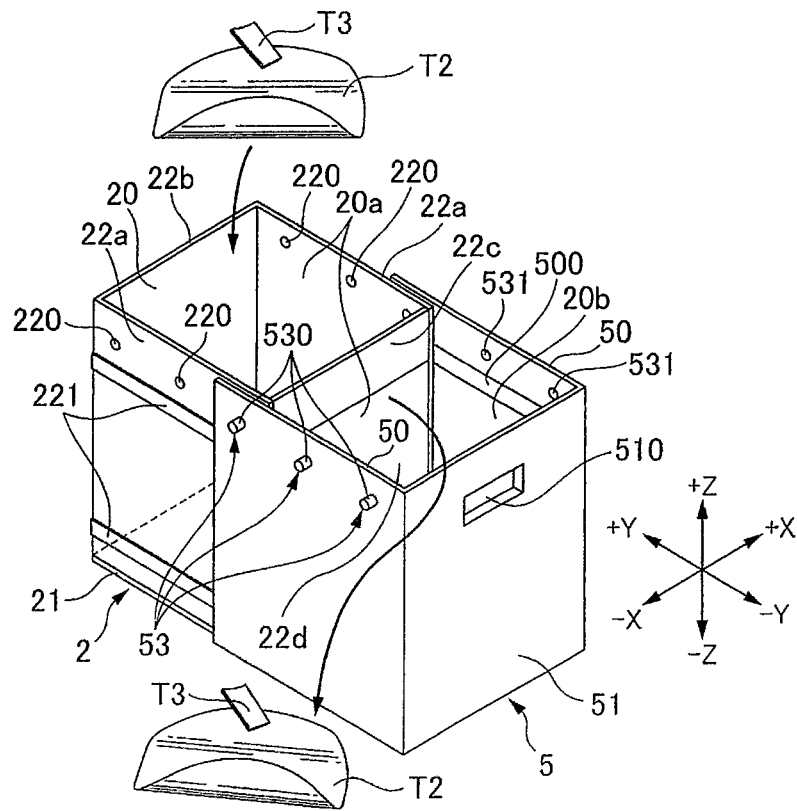
FIG. 4B is a perspective view depicting a condition that the upper opening is expanded to form an additional upper opening from which the protective member recovered into the recovery box can be removed.

As illustrated in FIGS. 4A and 4B, the recovery box 2 is a box having a shape like a rectangular prism. The recovery box 2 includes a bottom plate 21 (not illustrated in FIG. 4A) having a rectangular shape as viewed in plan and three side walls integrally connected with the bottom plate 21 so as to rise from the peripheral edge of the bottom plate 21 in the +Z direction. Accordingly, a space for storing the protective members T2 is defined by the bottom plate 21 and the three side walls. The opening 20 of the recovery box 2 is a rectangular upper opening from which the protective member T2 peeled off from the workpiece W is to be put into the recovery box 2. The three side walls of the recovery box 2 are composed of two side walls 22a opposed to each other in the X direction and one side wall 22b oriented in the Y direction.

As illustrated in FIG. 4B, the two side walls 22a are connected with each other at their upper portions on the side oriented in the −Y direction by a rectangular (oblong) partition plate 22c elongated in the X direction, so that a rectangular side opening 22d is formed below the partition plate 22c. The side opening 22d of the recovery box 2 is an opening for allowing the removal of the protective members T2 from the recovery box 2. The two side walls 22a are formed at their upper portions with three pairs of through holes 220 arranged at equal intervals in the Y direction. Each pair of through holes 220 is aligned with each other in the X direction. A pair of parallel guide rails 221 is formed on the outer side surface of each side wall 22a at its upper and lower portions so as to extend in the Y direction.

The removing mechanism 5 includes two side walls 50 opposed to each other in the X direction and one side wall 51 connecting the two side walls 50. A pair of parallel guide grooves 500 (one of which being illustrated) is formed on the inner side surface of each side wall 50 so as to extend in the Y direction. The pair of guide rails 221 of each side wall 22a of the recovery box 2 is slidably engaged with the pair of guide rails 500 of each side wall 50 of the removing mechanism 5 on the same side. As a modification, the pair of guide rails 221 of each side wall 22a and the pair of guide grooves 500 of each side wall 50 may be omitted.

A rectangular through hole 510 is formed as a handle at an upper portion of the side wall 51. The through hole 510 is adapted to be handled by the hand of an operator in drawing the removing mechanism 5 from the recovery box 2 from the condition illustrated in FIG. 4A to the condition illustrated in FIG. 4B. More specifically, in the condition where the recovery box 2 is surrounded by the side wall 51 and the two side walls 50 of the removing mechanism 5 as illustrated in FIG. 4A, the through hole 510 of the side wall 51 is handled by the operator's hand to draw the side wall 51 in the −Y direction as illustrated in FIG. 4B. Accordingly, the removing mechanism 5 can be drawn from the recovery box 2 in such a manner that the two side walls 50 slide on the two side walls 22a of the recovery box 2. In other words, the removing mechanism 5 can expand the upper opening 20 of the recovery box 2 from the condition illustrated in FIG. 4A to the condition illustrated in FIG. 4B. In the condition illustrated in FIG. 4B, the upper opening 20 of the recovery box 2 has been expanded to an upper opening 20a. In other words, the upper opening 20a is composed of the original upper opening 20 and an additional upper opening 20b defined by the partition plate 22c of the recovery box 2 and the side walls 50 and 51 of the removing mechanism 5.

Further, when the side wall 51 is pushed in the +Y direction by the operator from the condition illustrated in FIG. 4B, the two side walls 50 are slidingly moved on the outer side surfaces of the two side walls 22a of the recovery box 2 along the guide rails 221, so that the upper opening 20a illustrated in FIG. 4B can be contracted to the original upper opening 20 illustrated in FIG. 4A. Thus, the removing mechanism 5 according to the first preferred embodiment has an expanding and contracting function of expanding the opening 20 of the recovery box 2 illustrated in FIG. 4A to the opening 20a illustrated in FIG. 4B and also contracting the opening 20a to the original opening 20. Accordingly, the protective member T2 recovered into the recovery box 2 can be removed from the additional opening 20b communicating with the side opening 22d of the recovery box 2 as illustrated in FIG. 4B.

As illustrated in FIG. 4B, three optical sensors 53 are provided at the upper portions of the two side walls 50 so as to be arranged at equal intervals in the Y direction. Each optical sensor 53 is a transmission type optical sensor composed of a light emitting portion 530 provided on the side wall 50 in the −X direction and a light receiving portion 531 provided on the side wall 50 in the +X direction, in which the light emitting portion 530 is aligned with the light receiving portion 531 in the X direction. Further, in the condition illustrated in FIG. 4A, the three light emitting portions 530 are respectively aligned with the three through holes 220 formed through the side wall 22a in the −X direction, and the three light receiving portions 531 are respectively aligned with the three through holes 220 formed through the side wall 22a in the +X direction.

The protective member T2 can be removed from the recovery box 2 by the removing mechanism 5, during the operation of operating the peeling means 4 to peel off the protective member T2 from the upper surface Wa of the workpiece W by using the peeling tape T3 and then put the protective member T2 into the recovery box 2 illustrated in FIGS. 4A and 4B. Such a removing operation of operating the removing mechanism 5 will now be described.

When the holding means 41 illustrated in FIG. 1 cancels the holding of the peeling tape T3 attached to the protective member T2, the protective member T2 and the peeling tape T3 fall due to their own weight. Accordingly, the protective member T2 and the peeling tape T3 are put into the recovery box 2 from the upper opening 20 thereof illustrated in FIG. 4A. When the above peeling operation is continued, the protective members T2 and the peeling tapes T3 are accumulated on the bottom plate 21 of the recovery box 2.

In the condition where the upper opening 20 of the recovery box 2 is not expanded as illustrated in FIG. 4A, the plural protective members T2 peeled off from the workpieces W are accumulated in the recovery box 2 up to a predetermined height and detection light emitted from the light emitting portions 530 of the optical sensors 53 and passed through the through holes 220 of the side wall 22a of the recovery box 2 is blocked by the accumulated protective members T2 before reaching the light receiving portions 531 of the optical sensors 53, so that the filled condition of the recovery box 2 corresponding to the above predetermined height is detected by the optical sensors 53. In some case, the protective members T2 peeled off may be curved and rolled in the recovery box 2. In this case, the detection light is blocked by a small number of protective members T2 accumulated in the recovery box 2.

When the filled condition of the recovery box 2 is detected by the optical sensors 53, the peeling apparatus 1 operates a monitor (not illustrated) to display a warning message such that the protective members T2 must be removed from the recovery box 2. Alternatively, a speaker (not illustrated) is operated to sound a warning indicating that the protective members T2 must be removed from the recovery box 2.

When the operator is informed of such a warning, the through hole 510 of the side wall 51 is handled by the operator's hand and the side wall 51 is pulled in the −Y direction, so that the side wall 51 and the two side walls 50 surrounding the recover box 2 are drawn from the recovery box 2. As a result, the upper opening 20 of the recovery box 2 is expanded to the upper opening 20a as illustrated in FIG. 4B in such a manner that the additional opening 20b is defined by the partition plate 22c of the recovery box 2 and the side walls 50 and 51 of the removing mechanism 5. As a modification, moving means (not illustrated) for moving the side wall 51 in the −Y direction may be provided. In this case, when the filled condition of the recovery box 2 is detected by the optical sensors 53, the side wall 51 is automatically moved in the −Y direction by the moving means to expand the upper opening 20 to the upper opening 20a.

In the condition illustrated in FIG. 4B, the operator's hand is inserted from the additional upper opening 20b into the space defined by the side walls 50 and 51 and then passed through the side opening 22d formed below the partition plate 22c. Thereafter, the protective members T2 accumulated on the bottom plate 21 of the recovery box 2 are grasped by the operator's hand, and the operator's hand is next withdrawn from the additional upper opening 20b. The protective members T2 are thus removed from the recovery box 2.

The partition plate 22c is located at a substantially intermediate position in the expanded upper opening 20a in the Y direction so as to partition the expanded upper opening 20a. In other words, the partition plate 22c functions to prevent the operator's hand from being unnecessarily projected from the upper opening 20 of the recovery box 2 in grasping the protective members T2 accumulated in the recovery box 2. Accordingly, it is possible to eliminate the possibility for the operator's hand to come into contact with the holding means 41 located above the upper opening 20 of the recovery box 2 when the protective member T2 is to be put into the recovery box 2.

In this manner, the protective member T2 peeled off from the workpiece W by the peeling means 4 can be put into the recovery box 2 from the upper opening 20, during the operation of removing the protective members T2 accumulated in the recovery box 2 from the additional upper opening 20b by inserting the operator's hand from the additional upper opening 20b.

As described above, the peeling apparatus 1 according to the present invention essentially includes the holding table 30 for holding the lower surface Wb of the plate-shaped workpiece W in the condition where the upper surface Wa of the workpiece W is covered with the sheet-shaped protective member T2 and the peeling means 4 for peeling off the protective member T2 from the workpiece W held on the holding table 30, in which the recovery box 2 for recovering the protective member T2 peeled off by the peeling means 4 is provided in the peeling apparatus 1, the recovery box 2 having the upper opening 20 from which the protective member T2 peeled off from the workpiece W is to be put into the recovery box 2. Further, the removing mechanism 5 is provided in the peeling apparatus 1 so as to allow the protective member T2 to be put into the recovery box 2 from the upper opening 20 and also allow the protective member T2 recovered into the recovery box 2 to be removed from the recovery box 2 while the protective member T2 is being peeled off by the peeling means 4. Thus, the protective members T2 accumulated in the recovery box 2 can be removed from the recovery box 2 during the operation of peeling off the protective member T2 from the workpiece W. Accordingly, a continuous operation of the peeling apparatus 1 can be performed. Further, in the case where the peeling apparatus 1 functions as a tape mounter for attaching the dicing tape T1 to the ring frame F and the workpiece W and next peeling off the protective member T2 attached to the workpiece W, the protective member T2 can be removed from the recovery box 2 during the operation of peeling off the protective member T2, so that the dicing tape T1 can be attached to the workpiece W consecutively during the peeling operation.

According to the first preferred embodiment of the present invention, the removing mechanism 5 has an expanding and contracting function of expanding the upper opening 20 of the recovery box 2 to the upper opening 20a and contracting the expanded upper opening 20a to the original upper opening 20, whereby when the upper opening 20 is expanded to the upper opening 20a, the additional upper opening 20b is defined adjacent to the original upper opening 20, and the protective member T2 recovered into the recovery box 2 can be removed from the additional upper opening 20b. Thus, the protective members T2 accumulated in the recovery box 2 can be removed from the additional upper opening 20b during the peeling operation, so that the continuous operation of the peeling apparatus 1 can be performed.

The configuration of the recovery box 2 and the removing mechanism 5 according to the first preferred embodiment is not limited to that illustrated in FIGS. 4A and 4B. For example, the configuration of the removing mechanism 5 is not limited to the configuration that the side walls 50 and 51 are slidably moved in the Y direction. As a modification, each side wall 50 may be configured by a bellows that can be expanded and contracted in the Y direction. In this case, when the through hole 510 is handled by the operator's hand to pull the side wall 51, the bellows is expanded to thereby expand the upper opening 20 of the recovery box 2 to the upper opening 20a, whereas when the side wall 51 is pushed toward the recovery box 2 by the operator, the bellows in its expanded condition is contracted to thereby contract the upper opening 20a to the original upper opening 20. This bellows is not required to have a height from the upper end of each side wall 50 to the lower end thereof, in which the bellows is expanded and contracted in the Y direction. As a modification, the bellows may have a height from the upper end of each side wall 50 to a middle position in the Z direction, in which the bellows is obliquely expanded and contracted with respect to the Z direction.

(Recovery Box and Removing Mechanism According to a Second Preferred Embodiment)

Figure 5A:
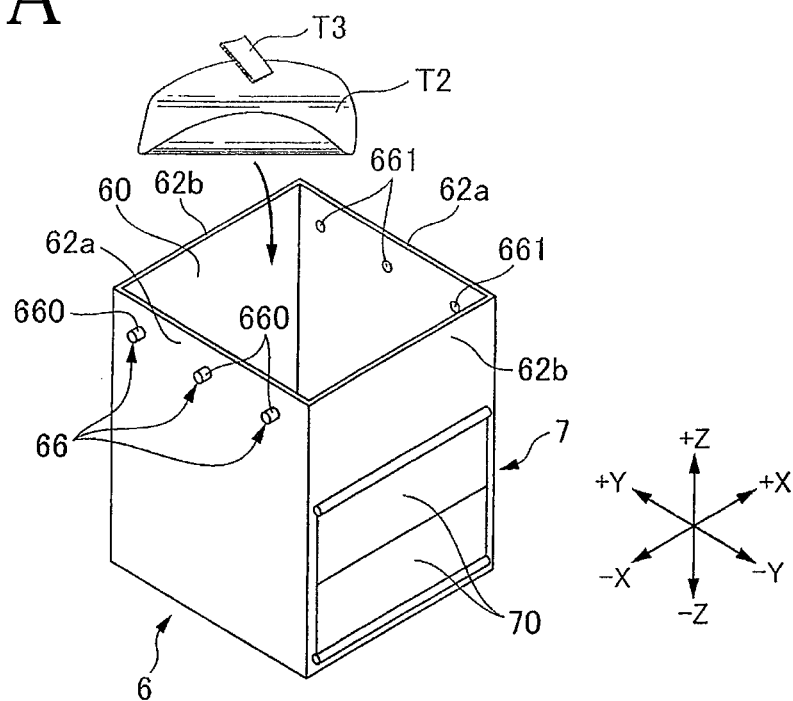
FIG. 5A is a perspective view depicting a recovery box and a removing mechanism according to a second preferred embodiment of the present invention in the condition where a door provided on one side surface of the recovery box is closed.
Figure 5B:
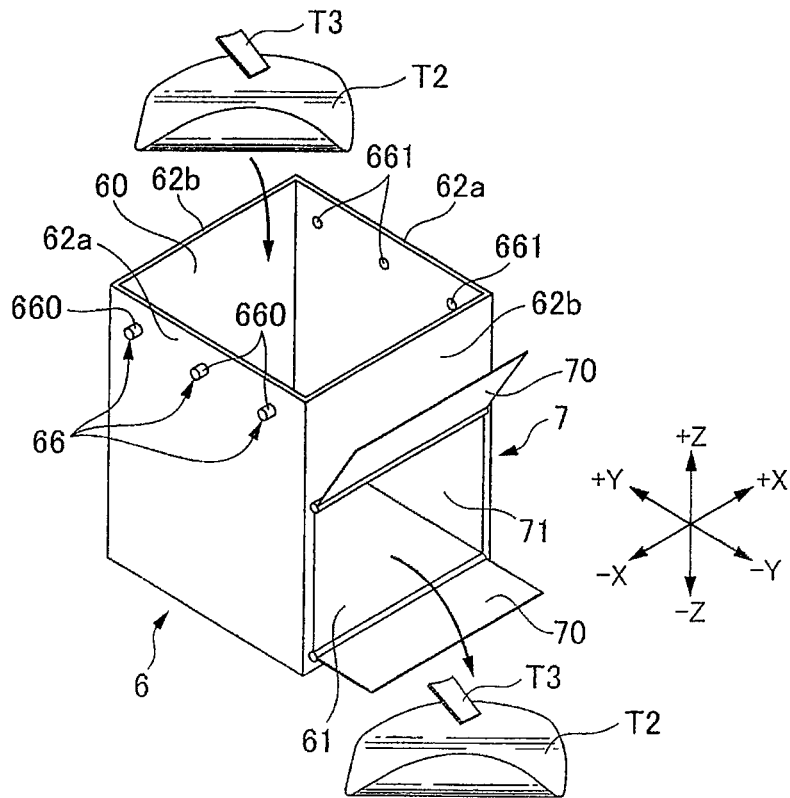
FIG. 5B is a perspective view depicting a condition that the door is opened to form a side opening from which the protective member recovered into the recovery box can be removed.

In the box area P illustrated in FIG. 1, the peeling apparatus 1 may include a recovery box 6 and a removing mechanism 7 illustrated in FIGS. 5A and 5B in place of the recovery box 2 and the removing mechanism 5 illustrated in FIGS. 4A and 4B. The recovery box 6 (which will hereinafter be regarded as a recovery box 6 according to the second preferred embodiment) functions to recover the protective member T2 peeled off by the peeling means 4. The removing mechanism 7 (which will hereinafter be regarded as a removing mechanism 7 according to the second preferred embodiment) functions to allow the protective member T2 to be put into the recovery box 6 from an opening 60 thereof and also allow the protective member T2 recovered into the recovery box 6 to be removed from the recovery box 6 while the protective member T2 is being peeled off by the peeling means 4.

As illustrated in FIGS. 5A and 5B, the recovery box 6 is a box having a shape like a rectangular prism. The recovery box 6 includes a bottom plate 61 (not illustrated in FIG. 5A) having a rectangular shape as viewed in plan and four side walls integrally connected with the bottom plate 61 so as to rise from the peripheral edge of the bottom plate 61 in the +Z direction. Accordingly, a space for storing the protective members T2 is defined by the bottom plate 61 and the four side walls. The opening 60 of the recovery box 6 is a rectangular upper opening from which the protective member T2 peeled off from the workpiece W is to be put into the recovery box 6. The four side walls of the recovery box 6 are composed of two side walls 62a opposed to each other in the X direction and two side walls 62b opposed to each other in the Y direction.

Three optical sensors 66 are provided at the upper portions of the two side walls 62a so as to be arranged at equal intervals in the Y direction. Each optical sensor 66 is a transmission type optical sensor composed of a light emitting portion 660 provided on the side wall 62a in the −X direction and a light receiving portion 661 provided on the side wall 62a in the +X direction, in which the light emitting portion 660 is aligned with the light receiving portion 661 in the X direction.

The removing mechanism 7 includes a door 70 located below the side wall 62b of the recovery box 6 in the −Y direction. The door 70 is a hinged double door adapted to be opened toward the outside of the recovery box 6 by operating a button (not illustrated) or a handle (not illustrated). In this case, when the button is pushed by the operator or the handle is pulled by the operator, the door 70 is opened. However, the door 70 is not limited to such a hinged double door. For example, the door 70 may be a sliding door adapted to be slidably moved parallel to the side wall 62b or a shutter type door including a bellows adapted to be expanded and contracted. As illustrated in FIG. 5B, a side opening 71 is formed by opening the door 70, so that the protective member T2 stored in the recovery box 6 can be removed from the side opening 71.

The protective member T2 can be removed from the recovery box 6 by the removing mechanism 7, during the operation of operating the peeling means 4 to peel off the protective member T2 from the upper surface Wa of the workpiece W by using the peeling tape T3 and then put the protective member T2 into the recovery box 6 illustrated in FIGS. 5A and 5B. Such a removing operation of operating the removing mechanism 7 will now be described.

When the holding means 41 illustrated in FIG. 1 cancels the holding of the peeling tape T3 attached to the protective member T2, the protective member T2 and the peeling tape T3 fall due to their own weight. Accordingly, the protectdive member T2 and the peeling tape T3 are put into the recovery box 6 from the upper opening 60 thereof illustrated in FIG. 5A. When the above peeling operation is continued, the protective members T2 and the peeling tapes T3 are accumulated on the bottom plate 61 of the recovery box 6.

In the condition where the door 70 of the removing mechanism 7 is closed as illustrated in FIG. 5A, the plural protective members T2 peeled off from the workpieces W are accumulated in the recovery box 6 up to a predetermined height and detection light emitted from the light emitting portions 660 of the optical sensors 66 is blocked by the accumulated protective members T2 before reaching the light receiving portions 661 of the optical sensors 66, so that the filled condition of the recovery box 6 corresponding to the above predetermined height is detected by the optical sensors 66.

When the filled condition of the recovery box 6 is detected by the optical sensors 66, the peeling apparatus 1 operates a monitor (not illustrated) to display a warning message such that the protective members T2 must be removed from the recovery box 6. Alternatively, a speaker (not illustrated) is operated to sound a warning indicating that the protective members T2 must be removed from the recovery box 6.

When the operator is informed of such a warning, the button or handle for opening the door 70 is operated by the operator to thereby open the door 70 as illustrated in FIG. 5B. Accordingly, the side opening 71 is formed to thereby allow the protective members T2 stored in the recovery box 6 to be removed from the recovery box 6. Thereafter, the operator's hand is inserted from the side opening 71 into the recovery box 6 to grasp the protective members T2 accumulated on the bottom plate 61 of the recovery box 6. Thereafter, the operator's hand is withdrawn from the side opening 71 to remove the protective members T2 from the recovery box 6.

As mentioned above, the operator's hand is inserted from the side opening 71 into the recovery box 6 in removing the protective members T2 accumulated in the recovery box 6. In other words, since the side opening 71 is formed below the side wall 62b of the recovery box 6, the operator's hand is prevented from being unnecessarily projected from the upper opening 60 of the recovery box 6 in grasping the protective members T2 accumulated in the recovery box 6.

Accordingly, it is possible to eliminate the possibility for the operator's hand to come into contact with the holding means 41 located above the upper opening 60 of the recovery box 6 when the protective member T2 is to be put into the recovery box 6. As a modification, moving means (not illustrated) for opening the door 70 may be provided. In this case, when the filled condition of the recovery box 6 is detected by the optical sensors 66, the door 70 is automatically opened by the moving means to form the side opening 71.

In this manner, the protective member T2 peeled off from the workpiece W by the peeling means 4 can be put into the recovery box 6 from the upper opening 60, during the operation of removing the protective members T2 accumulated in the recovery box 6 from the side opening 71 by inserting the operator's hand from the side opening 71.

According to the second preferred embodiment of the present invention, the removing mechanism 7 includes the door 70 openably provided on one side surface of the recovery box 6, whereby when the door 70 is opened, the side opening 71 is formed and the protective member T2 recovered into the recovery box 6 can be removed from the side opening 71. Thus, the protective members T2 accumulated in the recovery box 6 can be removed during the peeling operation, so that the continuous operation of the peeling apparatus 1 can be performed.

(Recovery Box and Removing Mechanism According to a Third Preferred Embodiment)

Figure 6A:
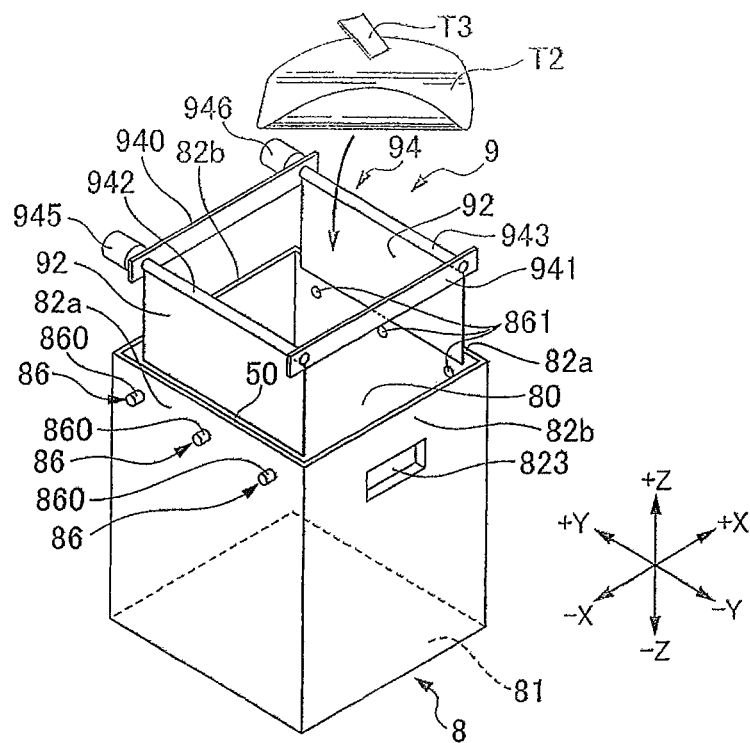
FIG. 6A is a perspective view depicting a recovery box and a removing mechanism according to a third preferred embodiment of the present invention in the condition where a pair of receiving plates is opened to allow the protective member to be dropped into the recovery box.
Figure 6B:
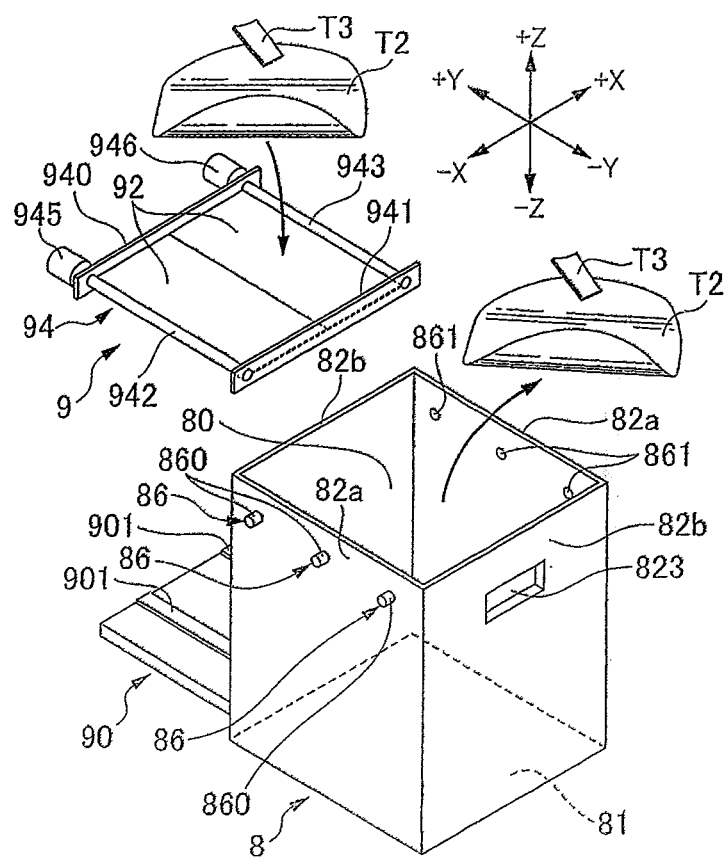
FIG. 6B is a perspective view depicting a condition that the recovery box is moved to a retracted position and the protective member recovered into the recovery box can be removed from the upper opening.

In the box area P illustrated in FIG. 1, the peeling apparatus 1 may include a recovery box 8 and a removing mechanism 9 illustrated in FIGS. 6A and 6B in place of the recovery box 2 and the removing mechanism 5 illustrated in FIGS. 4A and 4B or the recovery box 6 and the removing mechanism 7 illustrated in FIGS. 5A and 5B. The recovery box 8 (which will hereinafter be regarded as a recovery box 8 according to the third preferred embodiment) functions to recover the protective member T2 peeled off by the peeling means 4. The removing mechanism 9 (which will hereinafter be regarded as a removing mechanism 9 according to the third preferred embodiment) functions to allow the protective member T2 to be put into the recovery box 8 from an opening 80 thereof and also allow the protective member T2 recovered into the recovery box 8 to be removed from the recovery box 8 while the protective member T2 is being peeled off by the peeling means 4.

As illustrated in FIGS. 6A and 6B, the recovery box 8 is a box having a shape like a rectangular prism. The recovery box 8 includes a bottom plate 81 having a rectangular shape as viewed in plan and four side walls integrally connected with the bottom plate 81 so as to rise from peripheral edge of the bottom plate 81 in the +Z direction. Accordingly, a space for storing the protective members T2 is defined by the bottom plate 81 and the four side walls. The opening 80 of the recovery box 8 is a rectangular upper opening from which the protective member T2 peeled off from the workpiece W is to be put into the recovery box 8. The four side walls of the recovery box 8 are composed of two side walls 82a opposed to each other in the X direction and two side walls 82b opposed to each other in the Y direction.

Three optical sensors 86 are provided at the upper portions of the two side walls 82a so as to be arranged at equal intervals in the Y direction. Each optical sensor 86 is a transmission type optical sensor composed of a light emitting portion 860 provided on the side wall 82a in the −X direction and a light receiving portion 861 provided on the side wall 82a in the +X direction, in which the light emitting portion 860 is aligned with the light receiving portion 861 in the X direction. A rectangular through hole 823 as a handle is formed at the upper portion of the side wall 82b.

The removing mechanism 9 includes a slider 90 for allowing the recovery box 8 to be slidably moved between a first position set in the peeling apparatus 1 and a second position retracted from the first position (more specifically, to be slidably moved between the box area P and any position retracted from the box area P in the third preferred embodiment), a pair of receiving plates 92 provided so as to cover the upper opening 80 of the recovery box 8 for receiving the protective member T2 from the holding means 41, and a dropping portion 94 for dropping the protective member T2 from the receiving plates 92 into the recovery box 8.

The slider 90 is provided below the recovery box 8. The slider 90 has a rectangular shape as viewed in plan and includes a pair of guide rails 901 extending in the Y direction. The pair of guide rails 901 is slidably engaged with a pair of guide grooves (not illustrated) formed on the lower surface of the bottom plate 81 of the recovery box 8.

In the condition where the recovery box 8 is set in the peeling apparatus 1 as illustrated in FIG. 6A, the pair of receiving plates 92 is positioned directly above the recovery box 8.

The dropping portion 94 includes a pair of support plates 940 and 941 extending in the X direction so as to be opposed to each other in the Y direction, a pair of rotating shafts 942 and 943 supported to the support plates 940 and 941 at their opposite end portions so as to be rotatable through bearings (not illustrated) about the respective axes extending in the Y direction, and a pair of motors 945 and 946 connected to first ends of the rotating shafts 942 and 943 for rotating the rotating shafts 942 and 943, respectively. As a modification, the rotating shafts 942 and 943 may be rotated manually by the operator.

The pair of receiving plates 92 is fixed to the outer circumferential surfaces of the rotating shafts 942 and 943. Accordingly, when the rotating shafts 942 and 943 are rotated by the motors 945 and 946, respectively, the two receiving plates 92 are rotated to be opened or closed like a hinged double door.

Either of the guide rails 901 of the slider 90 is provided with a contact type or noncontact type sensor (not illustrated) for detecting that the recovery box 8 has been retracted from the box area P in the peeling apparatus 1 illustrated in FIG. 1 in the −Y direction. This sensor is electrically connected to a control unit (not illustrated) for controlling the motors 945 and 946. Accordingly, when the sensor detects the condition that the recovery box 8 has been retracted from the box area P as illustrated in FIG. 6B, information indicating this retracted condition is sent from the sensor to the control unit. When the control unit receives this information from the sensor, the control unit operates the motors 945 and 946 to rotate the rotating shafts 942 and 943, thereby rotating the two receiving plates 92 from the open condition illustrated in FIG. 6A to the closed condition illustrated in FIG. 6B.

The protective member T2 can be removed from the recovery box 8 by the removing mechanism 9, during the operation of operating the peeling means 4 to peel off the protective member T2 from the upper surface Wa of the workpiece W by using the peeling tape T3 and then put the protective member T2 into the recovery box 8 illustrated in FIGS. 6A and 6B. Such a removing operation of operating the removing mechanism 9 will now be described.

When the holding means 41 illustrated in FIG. 1 cancels the holding of the peeling tape T3 attached to the protective member T2, the protective member T2 and the peeling tape T3 fall due to their own weight. The two receiving plates 92 provided so as to cover the upper opening 80 of the recovery box 8 are previously opened as illustrated in FIG. 6A. Accordingly, the protective member T2 and the peeling tape T3 are put into the recovery box 8 from the upper opening 80 thereof illustrated in FIG. 6A. The protective members T2 and the peeling tapes T3 are accumulated on the bottom plate 81 of the recovery box 8.

In the condition where the two receiving plates 92 are open as illustrated in FIG. 6A, the plural protective members T2 peeled off from the workpieces W are accumulated in the recovery box 8 up to a predetermined height and detection light emitted from the light emitting portions 860 of the optical sensors 86 is blocked by the accumulated protective members T2 before reaching the light receiving portions 861 of the optical sensors 86, so that the filled condition of the recovery box 8 corresponding to the above predetermined height is detected by the optical sensors 86.

When the filled condition of the recovery box 8 is detected by the optical sensors 86, the peeling apparatus 1 operates a monitor (not illustrated) to display a warning message such that the protective members T2 must be removed from the recovery box 8. Alternatively, a speaker (not illustrated) is operated to sound a warning indicating that the protective members T2 must be removed from the recovery box 8.

When the operator is informed of such a warning, the through hole 823 is handled by the operator's hand to pull the recovery box 8 in the −Y direction as illustrated in FIG. 6B. Accordingly, the recovery box 8 is retracted from the box area P in the peeling apparatus 1 so as to slide on the slider 90 in the −Y direction. In concert with this operation, the two receiving plates 92 are automatically closed as illustrated in FIG. 6B.

Thereafter, the operator's hand is inserted from the upper opening 80 of the recovery box 8 retracted from the peeling apparatus 1 to grasp the protective members T2 accumulated on the bottom plate 81 of the recovery box 8. Thereafter, the operator's hand is withdrawn from the upper opening 80 to remove the protective members T2 from the recovery box 8.

As described above, the operator's hand is inserted from the upper opening 80 into the recovery box 8 in the condition where the holding means 41 for putting the protective member T2 into the recovery box 8 is not present above the upper opening 80. At the same time, the holding means 41 is located above the receiving plates 92 in their closed condition, and the protective member T2 is dropped from the holding means 41 onto the receiving plates 92 as illustrated in FIG. 6B. Accordingly, it is possible to eliminate the possibility for the operator's hand to come into contact with the holding means 41 located above the receiving plates 42 when the protective member T2 is to be dropped onto the receiving plates 92.

The protective member T2 peeled off from the workpiece W by the peeling means 4 is dropped onto the receiving plates 92 in their closed condition as illustrated in FIG. 6B during the operation of removing the protective members T2 from the recovery box 8 retracted from the peeling apparatus 1. Accordingly, the protective members T2 are accumulated on the receiving plates 92 in their closed condition.

After the operator finishes the removal of the protective members T2 from the recovery box 8, the recovery box 8 is pushed in the +Y direction to the original position illustrated in FIG. 6A. At the same time, the sensor provided on the slider 90 detects that the recovery box 8 has been returned to the box area P in the peeling apparatus 1 (i.e., the position illustrated in FIG. 6A). Information indicating this condition is sent from the sensor to the control unit for controlling the motors 945 and 946 of the dropping portion 94. As a result, the motors 945 and 946 are operated by the control unit to rotate the rotating shafts 942 and 943, thereby rotating the two receiving plates 92 from the closed condition illustrated in FIG. 6B to the open condition illustrated in FIG. 6A. Thereafter, the protective member T2 is newly dropped from the holding means 41 into the recovery box 8. At this time, the protective members T2 previously accumulated on the receiving plates 92 in their closed condition are also dropped into the recovery box 8 when the receiving plates 92 are opened.

According to the third preferred embodiment of the present invention, the removing mechanism 9 includes the slider 90 for allowing the recovery box 8 to be slidably moved between a first position set in the peeling apparatus 1 and a second position retracted from the first position, the receiving plates 92 provided so as to cover the upper opening 80 of the recovery box 8 for receiving the protective member T2 from the holding means 41, and the dropping portion 94 for dropping the protective member T2 from the receiving plates 92 into the recovery box 8. Thus, the protective members T2 accumulated in the recovery box 8 can be removed from the upper opening 80 during the peeling operation, so that the continuous operation of the peeling apparatus 1 can be performed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A peeling apparatus comprising:
    a holding table for holding a plate-shaped workpiece having an upper surface and a lower surface, the upper surface of the workpiece being covered with a protective member, the lower surface of the workpiece being held on the holding table;
    peeling means for peeling off the protective member from the workpiece held on the holding table; and
    a recovery box adapted to be set in the peeling apparatus for recovering the protective member peeled off by the peeling means, wherein
    the recovery box has an upper opening from which the protective member is to be put into the recovery box, and
    the peeling apparatus further includes a removing mechanism for allowing the protective member to be put into the recovery box from the upper opening and also allowing the protective member recovered into the recovery box to be removed from the recovery box, during the operation of the peeling means to peel off the protective member.

2. The peeling apparatus according to claim 1, wherein the removing mechanism has an expanding and contracting function of expanding the upper opening of the recovery box to a larger opening and contracting the larger opening to the upper opening, whereby when the upper opening is expanded to the larger opening, an additional opening is defined adjacent to the upper opening, and the protective member recovered into the recovery box can be removed from the additional opening.

3. The peeling apparatus according to claim 1, wherein the removing mechanism comprises a door openably provided on one side surface of the recovery box, whereby when the door is opened, a side opening is formed and the protective member recovered into the recovery box is removable from the side opening.

4. The peeling apparatus according to claim 1, wherein the removing mechanism includes a slider for allowing the recovery box to be slidably moved between a first position set in the peeling apparatus and a second position retracted from the first position, a receiving plate provided so as to cover the upper opening of the recovery box for receiving the protective member from the peeling means, and a dropping portion for dropping the protective member from the receiving plate into the recovery box, whereby when the recovery box is moved to the second position, the protective member is removable from the upper opening of the recovery box.

* * * * *